United States Patent
Tolle et al.

(10) Patent No.: US 7,141,957 B2
(45) Date of Patent: Nov. 28, 2006

(54) CONVERTER CIRCUIT AND CONTROL METHOD FOR SAME

(75) Inventors: Tobias Georg Tolle, Aachen (DE); Thomas Dürbaum, Langerwehe (DE); Reinhold Elferich, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/527,854
(22) PCT Filed: Sep. 17, 2003
(86) PCT No.: PCT/IB03/03979

§ 371 (c)(1),
(2), (4) Date: Mar. 16, 2005

(87) PCT Pub. No.: WO2004/027993
PCT Pub. Date: Apr. 1, 2004

(65) Prior Publication Data
US 2005/0258889 A1     Nov. 24, 2005

(30) Foreign Application Priority Data
Sep. 21, 2002 (DE) ................................ 102 43 885

(51) Int. Cl.
*G05F 1/618* (2006.01)
(52) U.S. Cl. ........................................ 323/284; 323/285
(58) Field of Classification Search ........ 323/223–225, 323/282, 284, 285, 271, 351
See application file for complete search history.

(56) References Cited

U.S. PATENT DOCUMENTS

| | | | |
|---|---|---|---|
| 5,479,089 A | 12/1995 | Lee | |
| 5,539,630 A | 7/1996 | Pietkiewicz et al. | |
| 6,028,418 A * | 2/2000 | Jovanovic et al. | 323/222 |
| 6,396,250 B1 * | 5/2002 | Bridge | 323/283 |
| 6,661,208 B1 * | 12/2003 | Rutter et al. | 323/224 |
| 6,724,175 B1 * | 4/2004 | Matsuda et al. | 323/224 |
| 2001/0036085 A1 | 11/2001 | Narita | |

* cited by examiner

*Primary Examiner*—Gary L Laxton
(74) *Attorney, Agent, or Firm*—Aaron Waxler; Paul Im

(57) ABSTRACT

In known converter circuits switching losses occur, which are caused by reverse-recovery currents of a freewheeling diode. To reduce said switching losses it is proposed by the invention to drive the switching elements such that, upon switching from the second to the first switching element, the timing is controlled in such a manner that the shoot through currents and the conduction of the freewheeling diode are kept at a low value or, better still, are precluded. As regards the control mechanism, it is proposed to turn on the first switching element later if shoot through currents occur, and to turn on the first switching element sooner if conduction of the freewheeling diode occurs. Here, a time of overlap may be provided during which both switching elements are simultaneously conducting. For the control mechanism, the voltage across a switching element can be used as a measured input value.

11 Claims, 9 Drawing Sheets

CONVERTER CIRCUIT AND CONTROL METHOD FOR SAME

The invention relates to a converter circuit and a control method as well as to a drive device for a converter circuit.

Converter circuits are used to convert an input voltage to an output voltage. Particularly for DC/DC converter circuits a plurality of topologies are known, i.e. circuits in which the switches employed therein are adequately driven so as to fulfill various requirements.

A known converter topology is the synchronous step-down converter (buck converter). On the side of its input, said buck converter comprises a half bridge with a first switching element (control) and a second switching element (sync), which half bridge is operated at an input DC voltage. The bridge arm connected between the switching elements comprises an inductor behind which the load is connected. The switching elements are alternately driven, for example, by means of a pulse duration control. Buck converters are used for a wide range of applications, including VRMs (Voltage Regulator Modules) for modern microprocessors.

The switching elements customarily comprise freewheeling diodes. When field effect transistors are used as switching elements, the freewheeling diode is part of the switching element, i.e. the diode between drain and source. When half bridges are driven, dead times are customarily set between the switching operations of the switching elements so as to preclude that conduction of the switching elements and the resultant shoot through currents (shoot-through) occur simultaneously. After turn-off of a switching element there is always a dead time in which both switching elements are turned off. In this dead time the current, which necessarily must be a continuous current due to the inductance on the output side, is maintained in that a freewheeling diode is conducting. As regards switching between the switching elements, a distinction can be made between "hard" and "soft" switching transitions (soft-switching). In the case of hard switching transitions, a switching element is turned on while a voltage is applied across the switching element. In the case of soft switching transitions, also referred to as ZVS (Zero Voltage Switching), no or only a very small voltage is applied across a switching element when said switching element is turned on. If the buck converter is operated in a manner such that the load current through the inductance does not change polarity (continuous operation), then a behavior is obtained such that a "hard" switching transition (switching from sync switch to control switch) and a ZVS transition (switching from control switch to sync switch) occurs within each switching period.

To achieve a further miniaturization of converter circuits as well as a very fast reaction to load alternations, high switching frequencies are desirable. What is problematic in this respect is that the switching losses increase with the frequency. A substantial part of these switching losses originates from the reverse current (reverse recovery current) of the freewheeling diode of the synchronous switch. In the case of synchronous buck converters, said reverse current accompanies hard switching transitions from the sync switch to the control switch. This problem is encountered also with other converter topologies.

In U.S. Pat. No. 5,539,630, known DC/DC switching converters are examined in respect of their drawbacks. As regards the buck converter, the reverse recovery problem is mentioned, which should be addressed by means of a circuit with a magnetic saturation element.

Also U.S. Pat. No. 5,479,089 considers various converter topologies such as, inter alia, buck and boost converters. To improve the switching efficiency of converters, a drive device is proposed which reduces freewheeling, i.e. the conduction of the freewheeling diode. Simultaneously, the switching elements are logically locked with respect to each other so as to ensure that they cannot be simultaneously conducting, thereby precluding shoot through currents.

In US-A1-2001/0036085 a description is given of a DC/DC converter. Said converter is a synchronous buck converter which is "soft-switching" operated, i.e. both switching transitions are "soft". In this case, the dead time between the switching of the switching elements is controlled within the drive circuit. By considering the derivation of the voltage across the sync-switching element, the dead time is set shorter or longer, resulting in an "ideal dead time".

In US-B1-6396250 a description is given of a synchronous buck converter wherein a high efficiency is aimed at. The first and the second switching element are driven at a variable dead time. A control mechanism sets the dead time to a value designated as the optimum value. For the control, the voltage across the second switching element is considered. If said voltage exceeds a predetermined threshold value ranging between 0 V and the forward voltage of the freewheeling diode, then a shorter dead time is set by means of a counter.

It is an object of the invention to provide a converter circuit as well as a drive device and a driving method for same, which enable a still further reduction of the switching losses as compared to the solutions in accordance with the prior art.

This object is achieved by a converter circuit as claimed in claim 1, a drive device as claimed in claim 9 and a driving method as claimed in claim 11. Dependent claims relate to advantageous embodiments of the invention.

The invention is based on the consideration that the losses associated with reverse recovery of the freewheeling diode can be precluded or reduced if in the case of a hard switching transition, conduction of said freewheeling diode can be precluded or at least substantially precluded. Said consideration in accordance with the invention implies that prior art topologies always had a dead time of positive duration in which, upon turn off of the second switching element, the current previously flowing through said second switching element was taken over by the freewheeling diode. If, however, the current is taken over by the other switching element instead, conduction of the freewheeling diode can be completely precluded under certain conditions. In any case, conduction can be reduced to such an extent that the reverse recovery time responsible for the recovery current is substantially reduced.

Therefore it is proposed in accordance with the invention that upon switching from the second switching element to the first switching element (i.e. the transition from a first state wherein the second switching element conducts and the first switching element does not conduct to a second state wherein the first switching element conducts and the second switching element does not conduct), the timing of driving the switching elements is controlled. Said control takes place by determining whether a shoot through current occurs or the freewheeling diode conducts. If a shoot through current occurs, the drive is changed such that the first switching element is turned on later. If it is determined that the freewheeling diode conducts, then the drive is changed such that the first switching element is turned on sooner. The terms "sooner" or "later" are to be interpreted in relation to the turn off of the second switching element. They do not define which one of the switching processes (turn on of the first switching element, turn off of the second switching element) occurs first. In principle, small dead times are possible (i.e. turn-on of the first switching element does not occur until after turn-off of the second switching element). Preferably, however, there is a period of overlap (i.e. turn on of the first switching element takes place before turn off of the second switching element).

Consequently, the invention turns away from known solutions that always contained a compulsory dead time between the turn-off of a switching element and the turn-on of another switching element. Instead, a real commutation is proposed wherein the first (control) switch takes over the load current from the second (sync) switch. The timing is of decisive importance here. The control mechanism in accordance with the invention enables said timing to be set such that ideally shoot through currents and conduction of the freewheeling diode are precluded.

As a result of the fact that conduction of the freewheeling diode is reduced or completely precluded, substantial losses due to reverse recovery do not take place. As a result, a substantial reduction of the switching losses is achieved, which is important, in particular, during operation at high switching frequencies.

The invention can preferably be applied to all converter topologies in which the freewheeling path of an inductive element runs via a switching element with a parallel freewheeling diode, with the switching transition at the switching element being a hard transition. In this connection, "hard turn-off" is to be taken to mean that the voltage across the switching element is changed from the forward to the reverse direction of the freewheeling diode. The freewheeling path of an inductive element is the current path that enables an inductive current to continue flowing after a switch, whose turn-on has brought about the current built up, has been turned off. The topologies in question comprise, for example, a half bridge as well as a fall bridge, as the latter is composed of two half bridges. Examples of such topologies include, in addition to synchronous buck converters, also synchronous boost converters, synchronous buck-boost converters, synchronous up/down converters as well as topologies derived therefrom. The switching elements used in actual circuits will customarily be field effect transistors wherein the freewheeling diode generally is not a separate component but, as for example with MOSFETs, a property of the semiconductor switch.

In accordance with a further embodiment of the invention it is provided that upon switching from the second to the first switching element the timing is such that a period of overlap is established during which both switching elements are simultaneously conducting. In this connection, a switch embodied so as to be a MOSFET is considered to be conducting if its gate voltage lies above the threshold voltage. The duration of the period of overlap is controlled by determining whether, after turn-off of the second switching element, a shoot through current occurs or conduction of the freewheeling diode occurs. If a shoot through current occurs, the duration of the period of overlap is reduced. If the freewheeling diode becomes conducting, then the duration of the period of overlap is increased. By virtue of this control strategy, the timing of the drive is optimized.

The voltage across the second switching element can be used as the measured value for the control. In accordance with a first proposal, the voltage variation is used to determine whether a shoot through current or conduction of the freewheeling diode occurs. This is possible, for example, by determining the absolute minimum value of this voltage within a switching interval. This minimum value occurs after turn off of the second switching element. If the freewheeling diode is conducting, the voltage drops to its forward voltage for some time. If a shoot through current occurs, the voltage polarity changes immediately after turn-off. In a preferred control mechanism, this can be taken into account in a very simple manner in that the timing, for example the period of overlap, is set such that the voltage minimum that sets itself assumes a value between the forward voltage of the switching element and the forward voltage of the freewheeling diode. The measurement of the minimum voltage is particularly simple because it concerns the detection of an absolute minimum. To measure such peak values, people skilled in the art can make use of known means, and the measurement must not be limited to a narrow time range within the switching period.

In accordance with an alternative proposal, the oscillation occurring after turn off of the second switching element and caused by charge switching of the switching capacitance is considered. The amplitude of this evanescent oscillation is minimal in the case where neither shoot through currents nor diode conduction occur. Preferably, the first peak value of the oscillation is measured, which is also the absolute maximum of the voltage during the switching period. By controlling the period of overlap so that the peak value is minimized, the control aimed at in accordance with the invention can be realized. Also in this case, the voltage peak value can be measured using simple means.

When measuring the voltage across a switching element it may occur that the accuracy of the measurement outside the housing is influenced, for example, by housing impedances. Therefore, a further embodiment of a switching element is proposed in which one or more additional, dedicated measuring lines are provided. While substantial currents flow through the available connecting lines, so that for example inductances, such as they occur at a bonding wire, already have a clear effect, the measuring line only serves to determine a voltage, such as, in the case of a MOSFET, the voltage across the drain-source path. When the voltage is measured, the current flowing through the measuring line is so small that the measuring result is only negligibly false.

In accordance with a further embodiment of the invention, the timing, i.e. for example the duration of the period of overlap, is controlled such that in at least a first switching period a measurement of electric quantities of the converter circuit takes place, on the basis of which the duration of the period of overlap is set for a further switching period that is posterior to the first switching period. As a result, also at high frequencies there is sufficient time for setting the timing. In this connection, it is not necessary for the second switching period to come directly after the first switching period, instead it may also be the switching period after next period, or one of the subsequent switching periods. Preferably, to set the tiring in a switching period, the measured values of a plurality of preceding switching periods are evaluated.

When the converter circuit in accordance with the invention starts operating, it is preferred that initially a dead time is observed between turn-off of the second switching element and turn-on of the first element. Since, as discussed above, the correct timing is critical, it is thus ensured that operation initially begins in a non-critical range, although with initially slightly higher losses. By the control in accordance with the invention, the timing of switching of the first and the second switching element is changed such that the initially set dead time is continuously reduced until finally the optimum is attained at which, if necessary, even a period of overlap is set.

In accordance with a further embodiment of the invention it is provided that upon switching from the second switching element to the first switching element, the first switching element is initially driven such that the current flowing through it is limited to a maximum value. In the case of a MOSFET this is achieved by driving at a reduced gate voltage. The maximum current value thus set is above the nominal output current of the converter circuit. Here it is possible that, for example, values are achieved in a range slightly above the nominal current, for example approximately 1.2 times the nominal current. The setting of a very high maximum value is also possible, for example a value approximately equal to or exceeding 2 times the nominal output current. The maximum value should be selected to be such that the limitation of the current thus obtained does not have any effect during normal operation since this is accompanied by high losses.

These and other aspects of the invention are apparent from and will be elucidated with reference to the embodiment(s) described hereinafter.

IN THE DRAWINGS

FIG. 2 shows a wiring diagram of an embodiment of the buck converter shown in FIG. 1a;

Figure 1A:
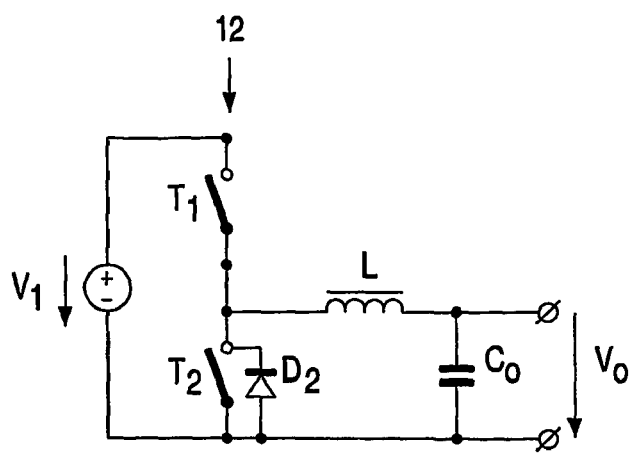
FIG. 1a shows a basic wiring diagram of a synchronous buck converter.
Figure 1B:
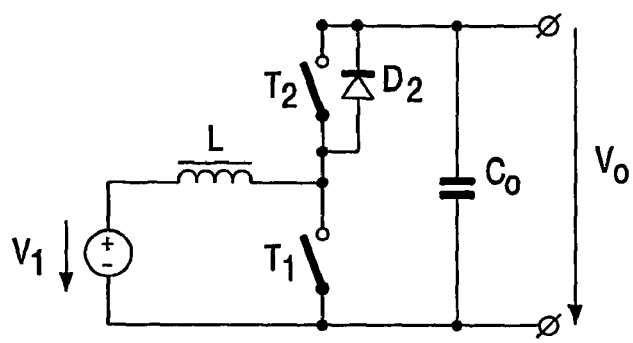
FIG. 1b shows a basic wiring diagram of a synchronous boost converter.
Figure 1C:
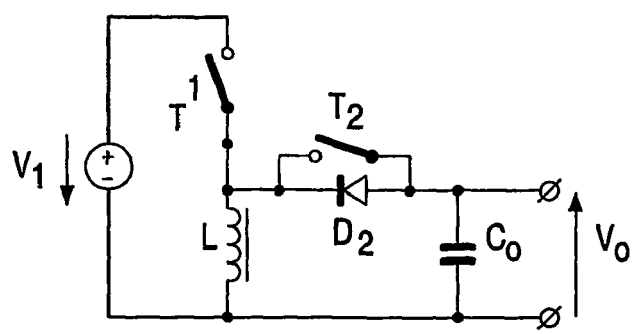
FIG. 1c shows a basic switching diagram of a synchronous buck-boost converter.
Figure 1D:
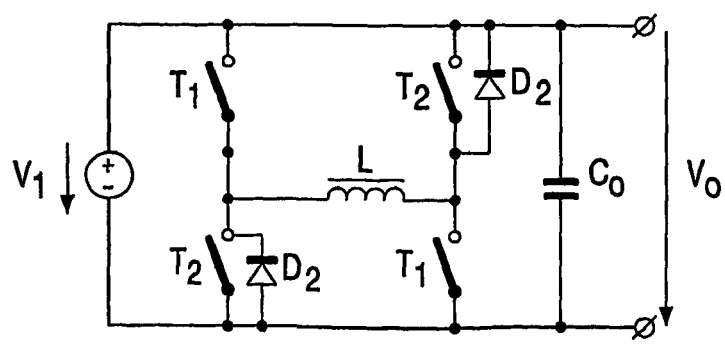
FIG. 1d shows a basic wiring diagram of a synchronous up/down converter.

FIGS. 1a–1d show converter circuits in accordance with the known topologies: buck converter (FIG. 1a), boost converter (FIG. 1b), buck-boost converter (FIG. 1c) and up/down converter (FIG. 1d). The converter circuits 10 each convert an input voltage $V_i$ to an output voltage $V_o$ at the output. The converter circuits 10 each comprise a first switching element $T_1$, a second switching element $T_2$ and an inductive element L. A freewheeling diode $D_2$ is part of a freewheeling path for the current through the inductive element L. The switching elements $T_2$, which in FIGS. 1a–1d are arranged parallel to the freewheeling diode $D_2$, serve as synchronous rectifiers, i.e. they are synchronized with $D_2$, so that they conduct if the diode $D_2$ would conduct without $T_2$ being present, in order to avoid the losses occurring as a result of the larger forward voltage.

$T_1$, $T_2$, which are ideally represented as switches in FIGS. 1a–d, in practice customarily take the form of MOSFETs, wherein the source-drain junction is switched by applying a gate voltage. In this case, customarily the diodes $D_2$ are not discrete components but rather the internal body diodes of the MOSFETs used.

Hereinbelow, an exemplary embodiment of the invention will be explained in greater detail with regard to the synchronous buck-converter topology. The synchronous buck converter shown in FIG. 1a comprises a first switching element $T_1$ (control switch) and a second switching element $T_2$ (sync switch) which are connected in the form of a half bridge 12 to the input voltage $V_i$. An inductance L is connected to the center of the bridge 13, the output $V_o$ being situated behind said inductance. A smoothing capacitor $C_o$ is arranged parallel to the output. A load (not shown) connected to the output would extend parallel to $C_o$. The function of the buck converter of FIG. 1a in a continuous mode of operation is known to those skilled in the art. The switches $T_1$, $T_2$ are driven with voltage pulses, for example a pulse width-modulated voltage, so that the output voltage $V_o$ obtained is reduced with respect to the input voltage $V_s$, the output voltage being controllable via driving of the switches (for example pulse duty ratio).

Figure 2:
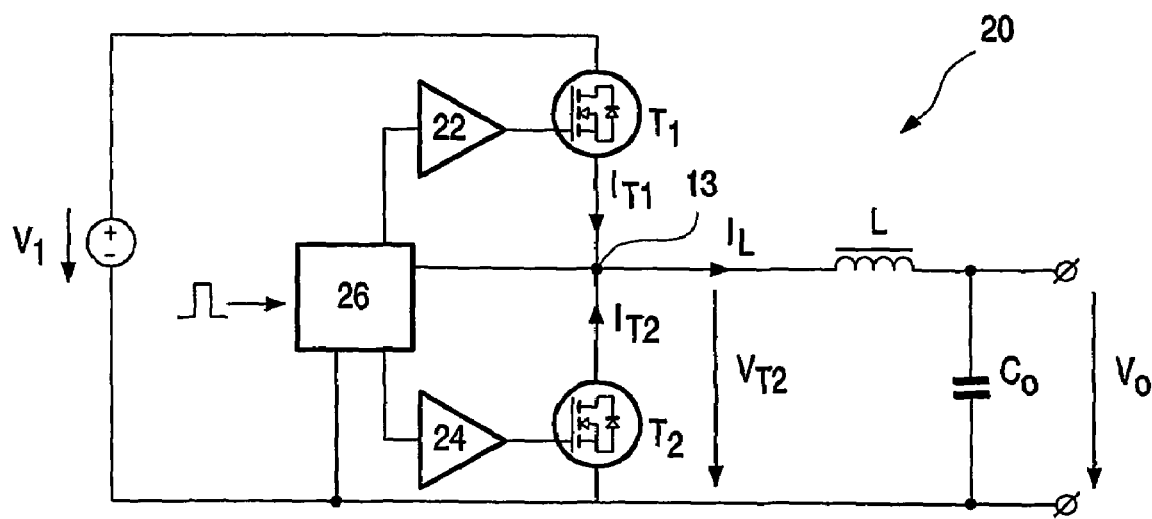

FIG. 2 shows a converter circuit 20 being an embodiment of the topology shown in FIG. 1. $T_1$, $T_2$ are embodied so as to be MOSFETs whose gate connections are each driven by drive circuits 22, 24. A controller 26 drives the drivers 22, 24. The controller 26 is also connected to the bridge center 13 and to ground, so that it is capable of detecting the voltage $V_{T2}$ across the second switching element. The freewheeling diode $D_2$ is the internal body diode (drain-source) of the switch $T_2$, $D_2$ not being separately shown again in FIG. 2. In addition, the switches $T_1$, $T_2$ have parasitic switching capacitances (not shown).

Figure 3:
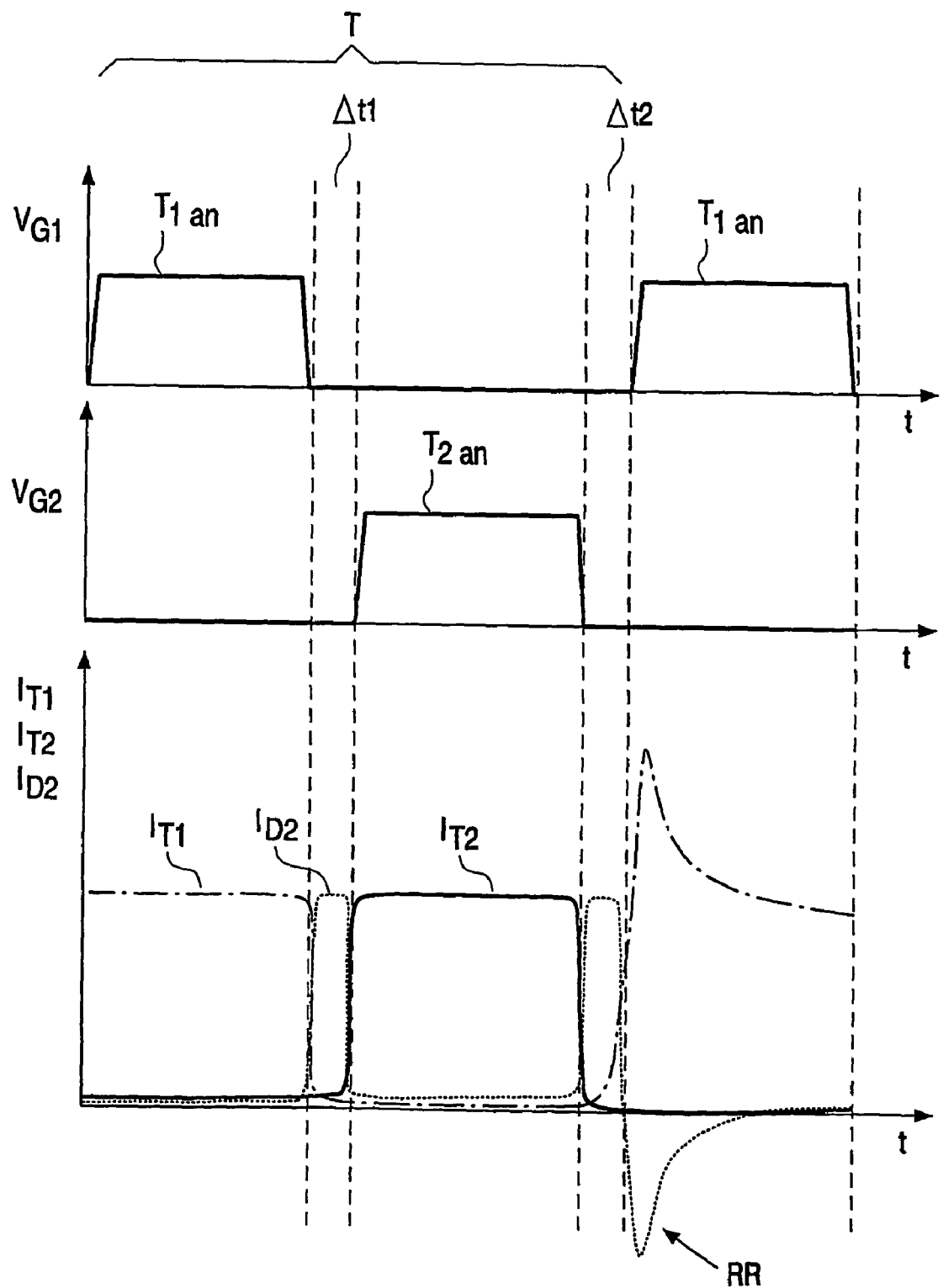
FIG. 3 shows a schematic diagram to illustrate the variation of currents and voltages of the circuit of FIG. 2 at a drive with a dead time (in accordance with the prior art)

FIG. 3 is a qualitative representation of the variation with respect to time of electrical quantities of the circuit 20 within a switching period T. $V_{G1}$ designates the gate voltage at the first switching element $T_1$, and $V_{G2}$ designates the gate voltage at the second switching element $T_2$. In FIG. 3, the variation with respect to time of the currents $I_{T1}$ through the first switching element, $I_{T2}$ through the second switching element and $I_{D2}$ through the freewheeling diode $D_2$ corresponds only to a qualitative representation that is used to show the basic variation of these quantities. Variations measured on real circuits may be different owing to a plurality of parasitic effects.

As shown in FIG. 3, the switches $T_1$, $T_2$ are each driven with voltage pulses, for example with a pulse width-modulated voltage. Their variation with respect to time (frequency, pulse duty ratio) is established by an input signal at control 26, for example to control the output voltage $V_o$ in known manner. FIG. 3 shows one of the successive switching periods T, which switching period first shows a range in which the switch $T_1$ is on, i.e. conducting. In this case, the current $I_L$ flows as $I_{T1}$ through the first switching element $T_1$. The switching from $T_1$ to $T_2$ takes place with a first dead time $\Delta t1$, in which process $T_1$ is first turned off and $T_2$ is not turned until at the end of the first dead time $\Delta t1$. As the current $I_L$ through the inductance L cannot decrease suddenly, in the first dead time interval $\Delta t1$ the freewheeling diode $D_2$ becomes conducting at the second switching element $T_2$. After turning on $T_2$, $T_2$ takes over the current $I_L$ as $I_{T2}$, so that the current $I_{D2}$ through the diode again decreases to zero. In the topology shown, this first switching transition from $T_1$ to $T_2$ is a "soft" switching transition, wherein turn on of $T_2$ occurs while its switching capacitance is not charged.

In connection with the present invention, the second switching process from $T_2$ to $T_1$ will now be considered. As regards the drive in accordance with the prior art (FIG. 3), a second dead time $\Delta t2$ was always provided for, in which case first the second switch $T_2$ is turned off and the first switch is not turned on again until after the dead time $\Delta t2$ had ended. The second switching transition is a "hard" switching transition wherein turn on of $T_1$ occurs at a point in time when its switching capacitance is charged to approximately $V_1$. During the dead time, the current $I_L$ is led again through the freewheeling diode D2 after the turn-on of $T_1$, the diode D2 is operated in the reverse direction however. A reverse current (reverse recovery) through the freewheeling diode D2 then takes place during a reverse recovery time, said freewheeling diode conducting in the reverse direction for a short period of time. This reverse current through the diode D2 is designated "RR" in FIG. 3. In this figure however the amplitude as well as the duration of the reverse recovery current are exaggerated for clarity. As the variation of the current $I_{T1}$ through the first switching element shows, the reverse recovery current leads to a clearly symmetrical increase of $I_{T1}$. This leads to substantial losses in the each switching cycle.

Figure 4:
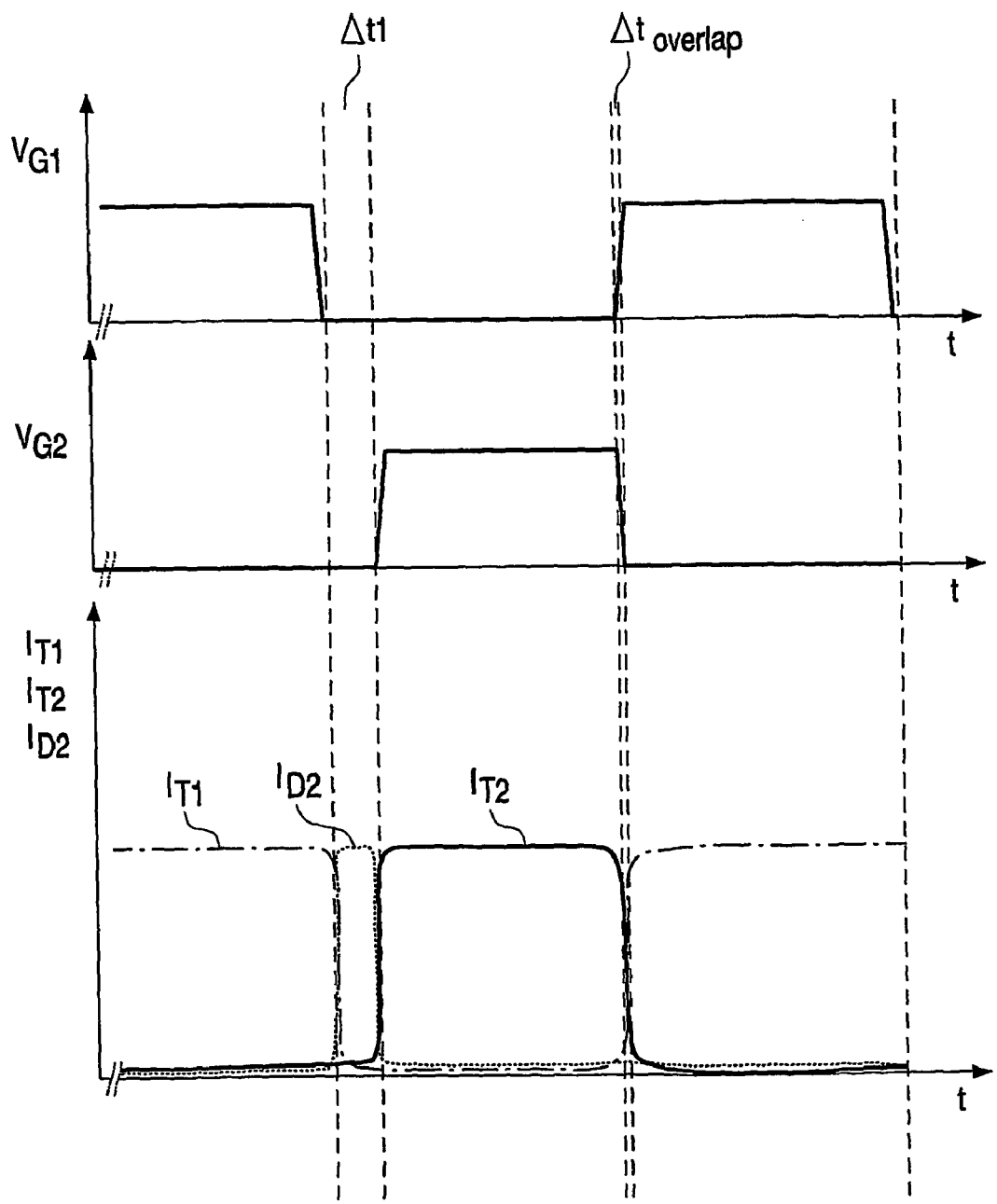
FIG. 4 shows a schematic diagram to illustrate the variation of currents and voltages of the circuit shown in FIG. 2 at a drive with an ideal time of overlap.

FIG. 4 shows a drive in accordance with a first embodiment of the invention. With this drive the buck converter 20 shown in FIG. 2 is driven in a special manner at the second switching transition, i.e. upon switching from the second switching element $T_2$ to the first switching element $T_1$.

As shown in FIG. 4, when driving takes place in accordance with the first embodiment of the invention, no second dead time $\Delta t2$ is provided for. Instead, the half bridge 12 is operated for a short period of overlap $\Delta t_{overlap}$ in such a manner that both $T_1$ and $T_2$ are conducting. As shown in FIG. 4, this ideally leads to a commutation of the current $I_L$ from $I_{T2}$ to $I_{T1}$. If in this case the extent to which $I_{T1}$ increases is equal to the extent to which $I_{T2}$ decreases, then, in the ideal case shown in FIG. 4, the diode $D_2$ will not start conducting, so that the current $I_{D2}$ remains zero during the second switching transition.

Figure 5:
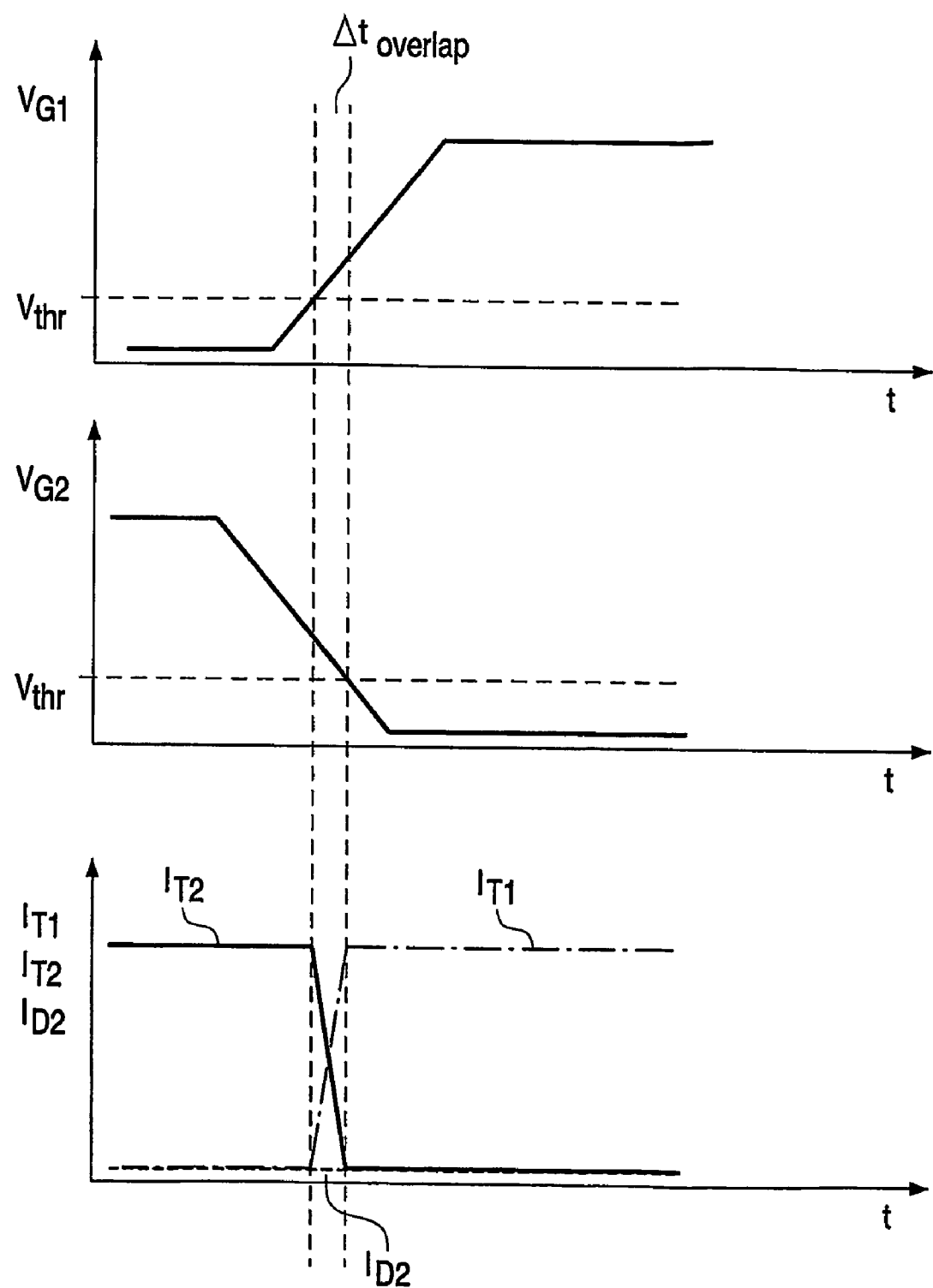
FIG. 5 shows the second transition of FIG. 4 on an enlarged scale.

In FIG. 5, the second switching transition of FIG. 4 is shown on an enlarged time scale. The aim of this Figure is to qualitatively depict the variations of the quantities shown. Said simplified qualitative representation serves to give a better understanding. In the illustrations shown in FIG. 4 and FIG. 5, for example, the charge switching of the switching capacitances of the switches $T_1$, $T_2$ is ignored. In fact, $T_1$ must carry current for a short, additional period of time to attain charge switching of the switching capacitances.

The time of overlap $\Delta t_{overlap}$ comprises the range in which both switches $T_1$, $T_2$ are simultaneously conducting, i.e. the respective gate voltages $V_{G1}$, $V_{G2}$ are above the threshold voltages $V_{thr}$ of the MOSFETs. In a concrete embodiment, the time of overlap $\Delta t_{overlap}$ will be very short, for example a few nanoseconds.

In FIG. 5, the variation of the gate voltage $V_{G1}$ and $V_{G2}$ upon turn on of the first switching element shows a possible variation of these voltages. The actual variation depends on a number of factors (for example gate-source capacitance, properties of the driver module etc.) and may be different. Likewise, the dependence of the conductance of the drain-source paths of the two switches on the gate voltages is highly non-linear. The variation of each of the gate voltages is not decisive here; what is important is the variation of the currents $I_{T2}$, $I_{T1}$. Ideally, as shown in FIG. 5, a timing can be found that results in an ideal commutation from $I_{T2}$ to $I_{T1}$ without the diode $D_2$ becoming conducting.

Figure 6:
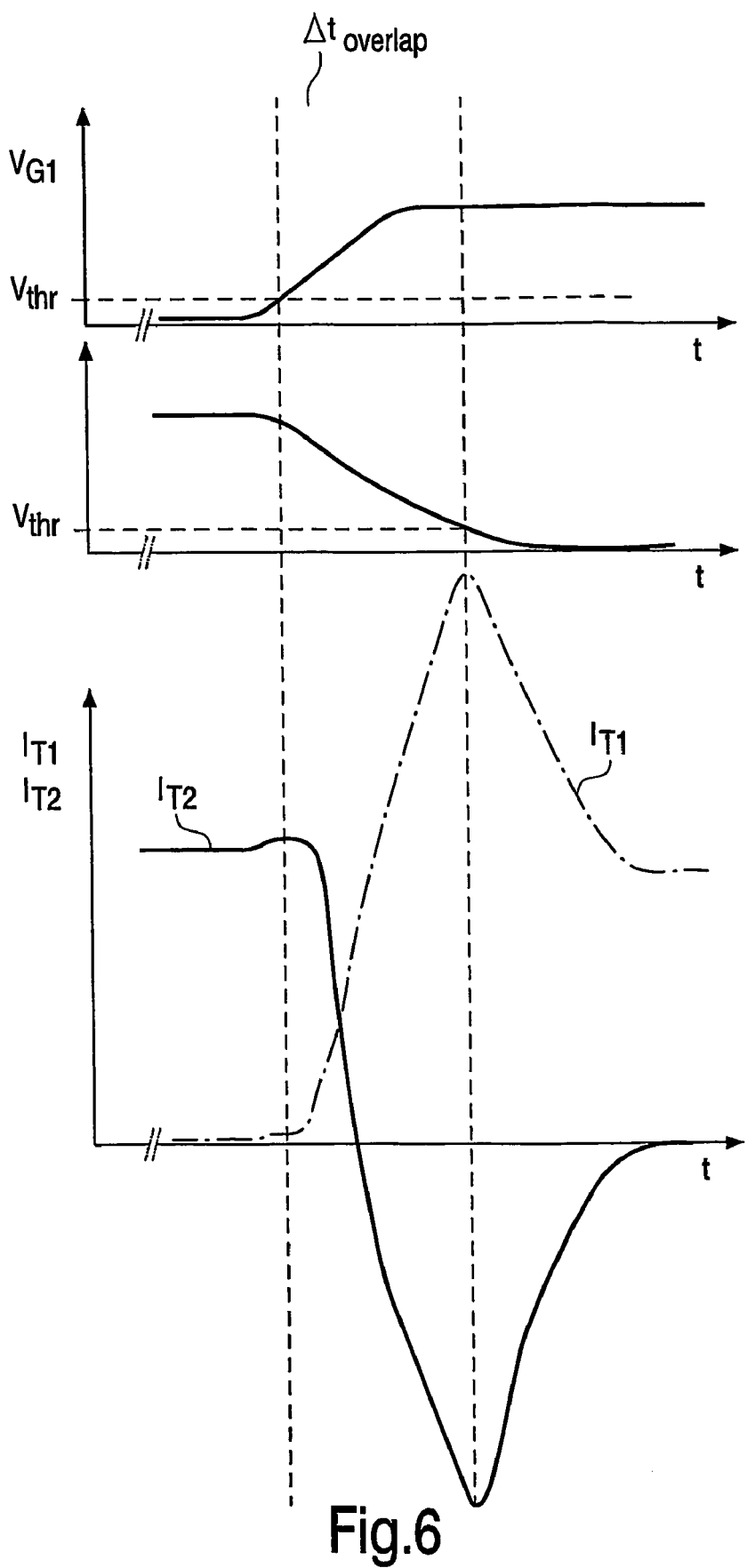
FIG. 6 shows a schematic diagram to illustrate the variation of currents and voltages of the circuit shown in FIG. 2, in which driving takes place with too long a period of overlap and in the presence of shoot through currents.

With the drive in accordance with the first embodiment of the invention, exact timing is decisive. If the time interval between switching from $T_2$ to $T_1$ is too long, i.e. if the dead time $\Delta t2$ is chosen too long or the period of overlap $\Delta t_{overlap}$ is chosen too short, then the diode $D_2$ will become conducting, as shown in FIG. 3, and subsequently a reverse recovery current with the associated losses will occur. If, on the other hand, the period of overlap $\Delta t_{overlap}$ is chosen to be too long, then the simultaneous conduction of both switches $T_1$, $T_2$ causes a shoot through current in which current flows as a short-circuit current from input $V_i$ directly through the switches $T_1$, $T_2$ (shoot-through current). This situation is shown in FIG. 6. The long period of overlap $\Delta t_{overlap}$ chosen here results in a negative current flow $I_{T2}$ through the second switching element $T_2$. The associated peak also occurs in a mirror-inverted manner as a substantially increased current $I_{T1}$ through the first switching element $T_1$. Such a shoot through current causes extremely high losses and may cause damage to the switching elements $T_1$, $T_2$.

Consequently, in a concrete embodiment it is extremely difficult to determine and set the optimum timing (FIG. 5) in advance because the behavior depends on many factors, such as the properties of the components, but also on the operating state (load, temperature etc.). Therefore, to obtain the best possible timing to ensure that a commutation from $I_{T1}$ to $I_{T2}$ takes place as shown in FIGS. 4 and 5, the controller 26 is used to control the timing of switching of $T_1$ and $T_2$. The controller 26 sets the timing for each switching period T in such a manner that, on the one hand, conduction of the diode $D_2$ and the subsequent reverse-current are precluded, and, on the other hand, also a shoot through current is precluded. Said control provides for a later turn-on of $T_1$, i.e. it reduces $\Delta t_{overlap}$, if a shoot through current occurs. If conduction of the diode $D_2$ is detected upon switching from the second switching element $T_2$ to the first switching element $T_1$, then $T_1$ is turned on sooner, i.e. $\Delta t_{overlap}$ is increased.

Figure 7:
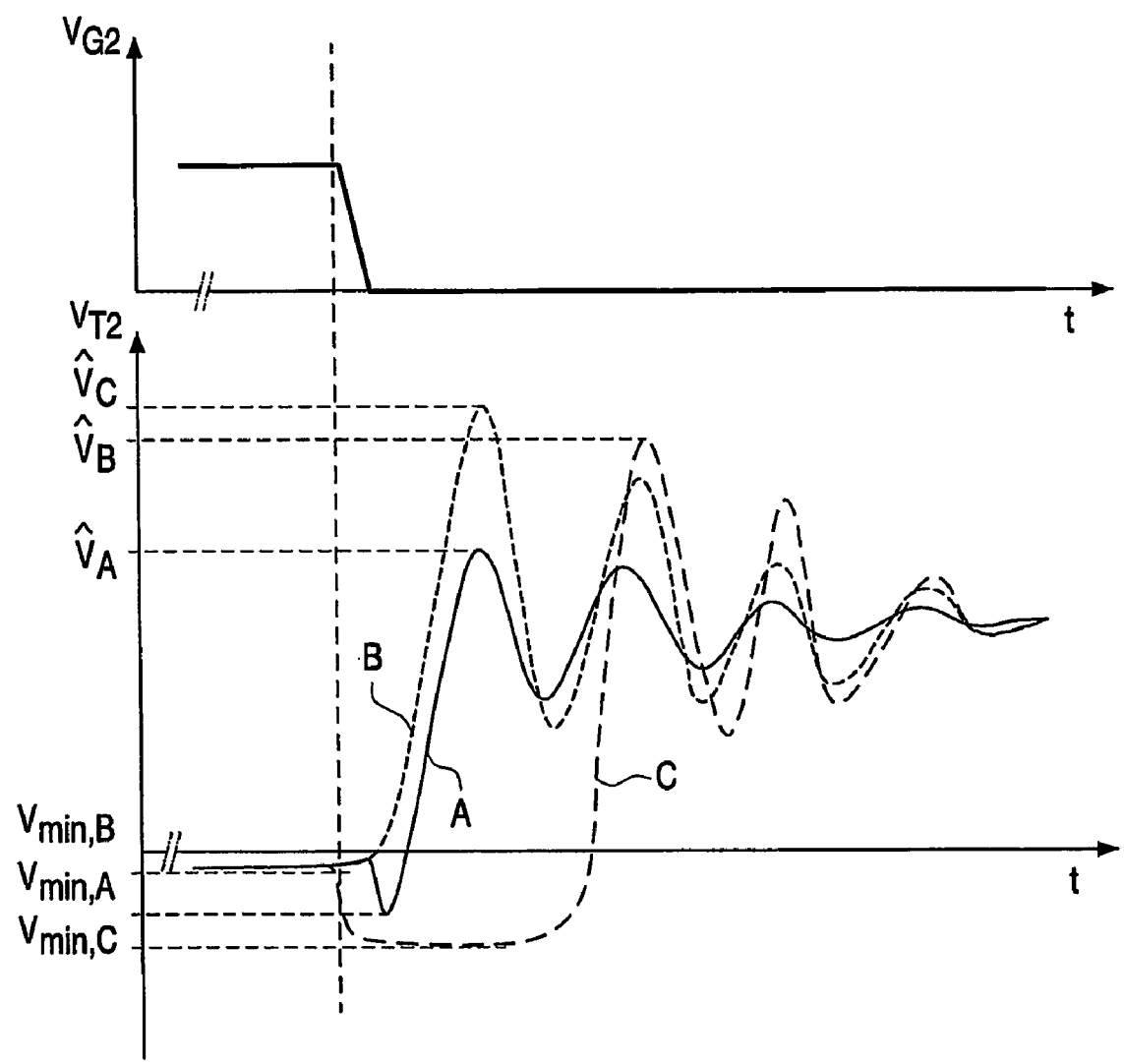
FIG. 7 shows a schematic diagram illustrating the variation of the voltage across the second switching element shown in FIG. 2.

A distinction between, on the one hand, the above-mentioned cases of diode conduction, and, on the other hand, shoot through current can be made by considering the voltage $V_{T2}$ across the second switching element $T_2$. For this purpose, the controller 26 comprises appropriates inputs. In FIG. 7, the variation of the voltage $V_{T2}$ after turn-off of the second switching element $T_2$ is shown. Three variations with respect to time A, B and C are shown, B being the variation of $V_{T2}$ upon the occurrence of a shoot through current, C the voltage variation in the case of diode conduction and A a variation that is aimed at, whereby both diode conduction and shoot through currents are precluded. The representation of FIG. 7 is a purely qualitative approach intended to provide a basis explanation of the interrelationships.

When $T_2$ is conducting, the voltage $V_{T2}$ has a small, negative value which corresponds to the forward voltage of the switching element $T_2$, i.e. for example approximately $-0.1$ V in the case of a MOSFET. As regards curve C, the diode $D_2$ starts conducting after turn-off of $T_2$. As a result, the voltage $T_2$ decreases to the forward voltage of the diode $D_2$ of, for example, approximately $-0.7$ V, which is slightly higher than the forward voltage of a MOSFET. After the switching element $T_1$ has completely taken over the current $I_L$, the diode $D_2$ is blocked and the voltage $V_{T2}$ increases. As a result, the switching capacitance of $T_2$ is charged, which leads to the decaying oscillation of $V_{T2}$ shown in FIG. 7 (the switching capacitance of $T_2$ forms a series-resonant circuit with continuously available parasitic inductances). Since the oscillation decays, the first maximum $\hat{V}_C$ is the maximum of the voltage. This maximum is too high during conduction of the diode $D_2$. In the absence of a minimum and a maximum of the voltage $V_{T2}$, in the case of curve C, a $V_{min,\,C}$ is then obtained which corresponds to the negative forward voltage of the diode $D_2$ and a relatively high voltage maximum $\hat{V}_C$ is obtained.

In the case of too long a period of overlap $\Delta t_{overlap}$ and the resultant shoot through current, the voltage $V_{T2}$ varies approximately as shown in curve B. From the negative forward voltage of the switch $T_2$ the voltage rapidly increases without a preceding decrease. Also here a decaying oscillation of the voltage $V_{T2}$ occurs. In this case too, the height of the first maximum $\hat{V}_B$ depends on the current $I_{T2}$ that has flowed at the moment turn off of $T_2$ takes place. As this current corresponds to the shoot through current, $\hat{V}_B$ is clearly excessively high when such a current occurs. The curve B is thus characterized by a voltage minimum $V_{min,\,B}$, which corresponds to the forward voltage of $T_2$, and a high voltage maximum $\hat{V}_B$.

An aimed at variation of $V_{T2}$ that is to be achieved with the aid of the control is represented by curve A. From the initially slightly negative value (forward voltage of $T_2$), $V_{T2}$ does not rise immediately after turn-off of $T_2$ (this would be an indication of a shoot through current), but rather decreases slightly to a value $V_{min,\,A}$. From there, $V_{T2}$ rises, while also in this case a decaying oscillation occurs. The amplitude thereof and hence also the first maximum $\hat{V}_A$ is substantially smaller than in the cases B (shoot through current) and C (diode conduction). Thus, the curve A is characterized in respect of minimum and maximum by a small $\hat{V}_A$ and a $V_{min,\,A}$ that lies between the forward voltage of $T_2$ and the forward voltage of the diode $D_2$.

In the first embodiment of a control 26, the maximum value of the voltage $V_{T2}$ that adjusts itself after turn off of $T_2$ is measured. The control is designed such that the value $\hat{V}_{T2}$ is controlled to a minimum, which could correspond, for example, to curve A in FIG. 7. The problem encountered with this control is that, at an increased value of $\hat{V}_{T2}$, it cannot be readily determined whether this can be attributed to too fast a timing (shoot through current, curve B) or too slow a timing (diode conduction, curve C). This problem can be addressed, however, by approaching the optimum timing (minimum value of $\hat{V}_{T2}$) always from one side. Thus, as shown in FIG. 2, the timing can initially begin with, for example, a dead time $\Delta t2$. Said dead time is reduced step by step until $\hat{V}_{T2}$ has reached a minimum value.

In a second, preferred embodiment, the voltage variation of $\hat{V}_{T2}$ after turn off of $T_2$ is considered in respect of the minimum that adjusts itself. As explained in connection with FIG. 7, the curves A, B and C can be clearly distinguished by means of the minimum value of $V_{T2}$ obtained after turn off of $T_2$. The control aims at adjusting the minimum value of $V_{T2}$ to a fixed value $V_{min,\,A}$ that lies between the forward voltage of $D_2$ ($V_{min,\,C}$) and the forward voltage of $T_2$ ($V_{min,\,B}$) If use is made of a MOSFET, the control could aim at a predetermined value for $V_{min,\,A}$ of, for example, $-0.3$ V. If a value of $V_{T2min}$ is obtained that is higher than said value (indication of shoot through current) then the timing is changed such that $T_1$ is turned on later. If a value of $V_{T2min}$ below said predetermined value is obtained (indication of diode conduction), then the timing is changed such that $T_1$ is turned on sooner.

The two embodiments of the control 26 shown above are meant as examples. On the one hand, the variation of the voltage $V_{T2}$ as qualitatively represented in FIG. 7 can be observed in a different manner so as to determine whether shoot through currents or diode conduction occur. On the other hand, also other electrical quantities of the circuit 10 can be detected, such as the current $I_{T2}$, and conclusions regarding the behavior can be drawn from the data thus obtained. Alternatively, the above-mentioned criteria for assessing the curve variation of $V_{T2}$ can be combined to form a sure judgment.

When implementing a concrete control, the controller 26, after having been turned on, initially operates such that a drive operation with a dead time (FIG. 3) takes place. In each switching period T, electrical quantities of the circuit 20 are then observed as indicated hereinabove. On the basis of said observations in one or more switching periods, the specified value for the timing in the subsequent (or one of the subsequent) switching periods is set by means of the above-mentioned control. Starting out from an initially substantial dead time after turn on, this leads to a reduction of said dead time until the desired result is attained, i.e. an optimum timing with direct commutation from $T_2$ to $T_1$. This result of the control will probably be achieved at a dead-time range of negative duration, i.e. a short period of overlap $\Delta t_{overlap}$. The timing is controlled more and more, so that a change in the operating conditions, for example a load change, triggers a rapid reaction.

In a third embodiment of the invention, the first switching element $T_1$ is driven in a protection period after turn on at a reduced gate voltage. By driving at a suitably reduced gate voltage, the current flowing through a MOSFET can be limited to a maximum value. However, if this limitation becomes active, i.e. if, without the low gate voltage, a higher current would flow than that corresponding to the maximum value, then, at the MOSFET, an increased voltage drop and a correspondingly high power dissipation occur. Therefore, for the third embodiment of the invention, it is proposed to drive at a gate voltage such that the resultant maximum current through the first switching element $T_1$ is higher than the current $I_{Nenn}$ flowing through $T_i$ during nominal operation. Thus, this type of drive serves to limit increased currents $I_{T1}$ that occur in connection with shoot through currents.

Figure 8:
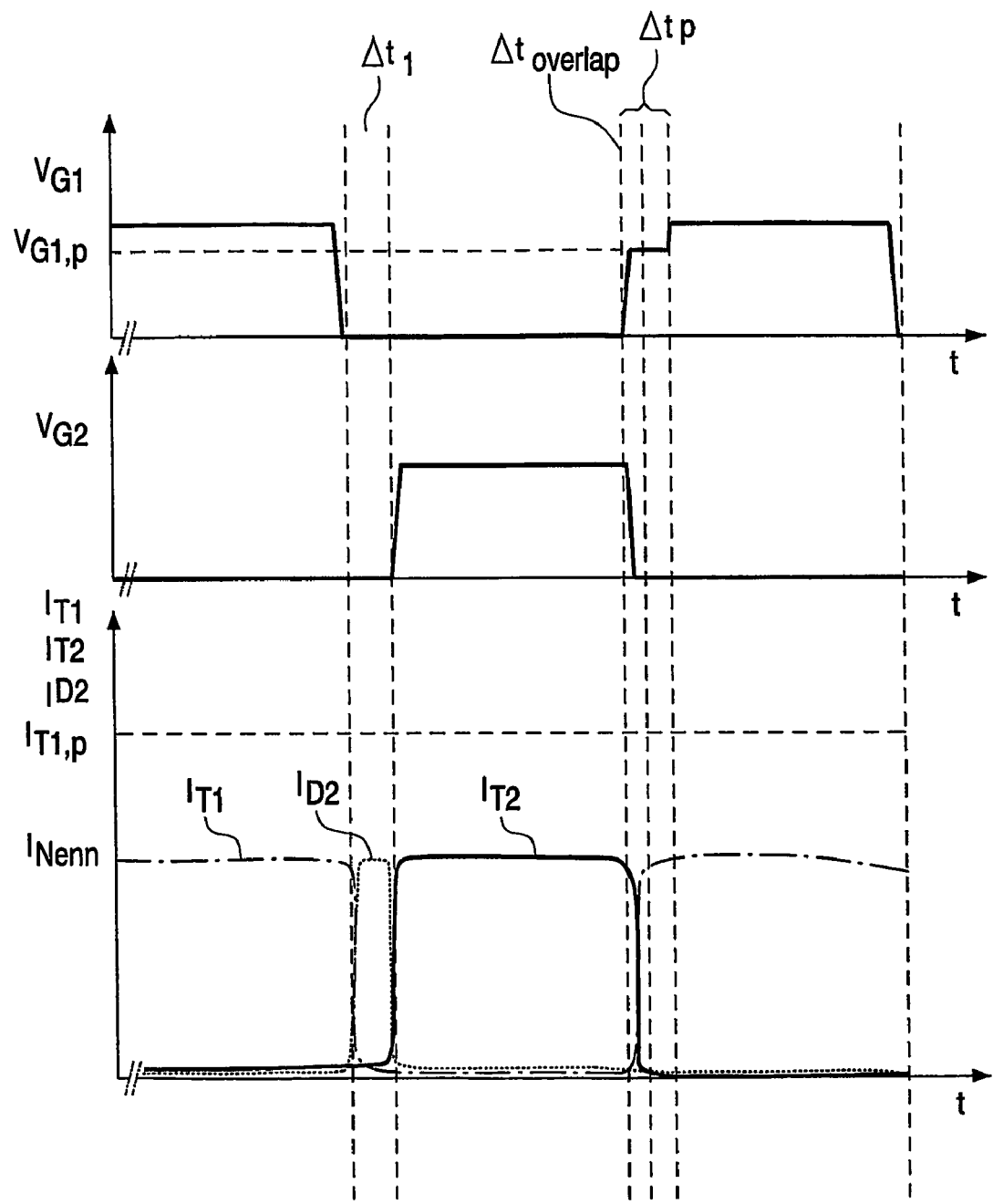
FIG. 8 shows a schematic diagram to illustrate the variation of currents and voltages of the circuit shown in FIG. 1, wherein driving takes place at a lower gate voltage.

A corresponding drive is qualitatively shown in FIG. 8. For a short period of time $\Delta tp$, which includes the turn-on instant of $T_1$, the gate voltage $V_{G1}$ at the first switching element $T_1$ is not set to the maximum value but only to a reduced value $V_{G1,\,p}$. As this value $V_{G1,\,p}$ is chosen to be so high that the current $I_{T2}$, which can maximally reach the nominal current $I_{Nenn}$ and hence is below the threshold value $I_{T1,\,p}$ specified thereby, is not influenced, the changed drive does not have an effect on the normal operation depicted in FIG. 8.

Figure 9:
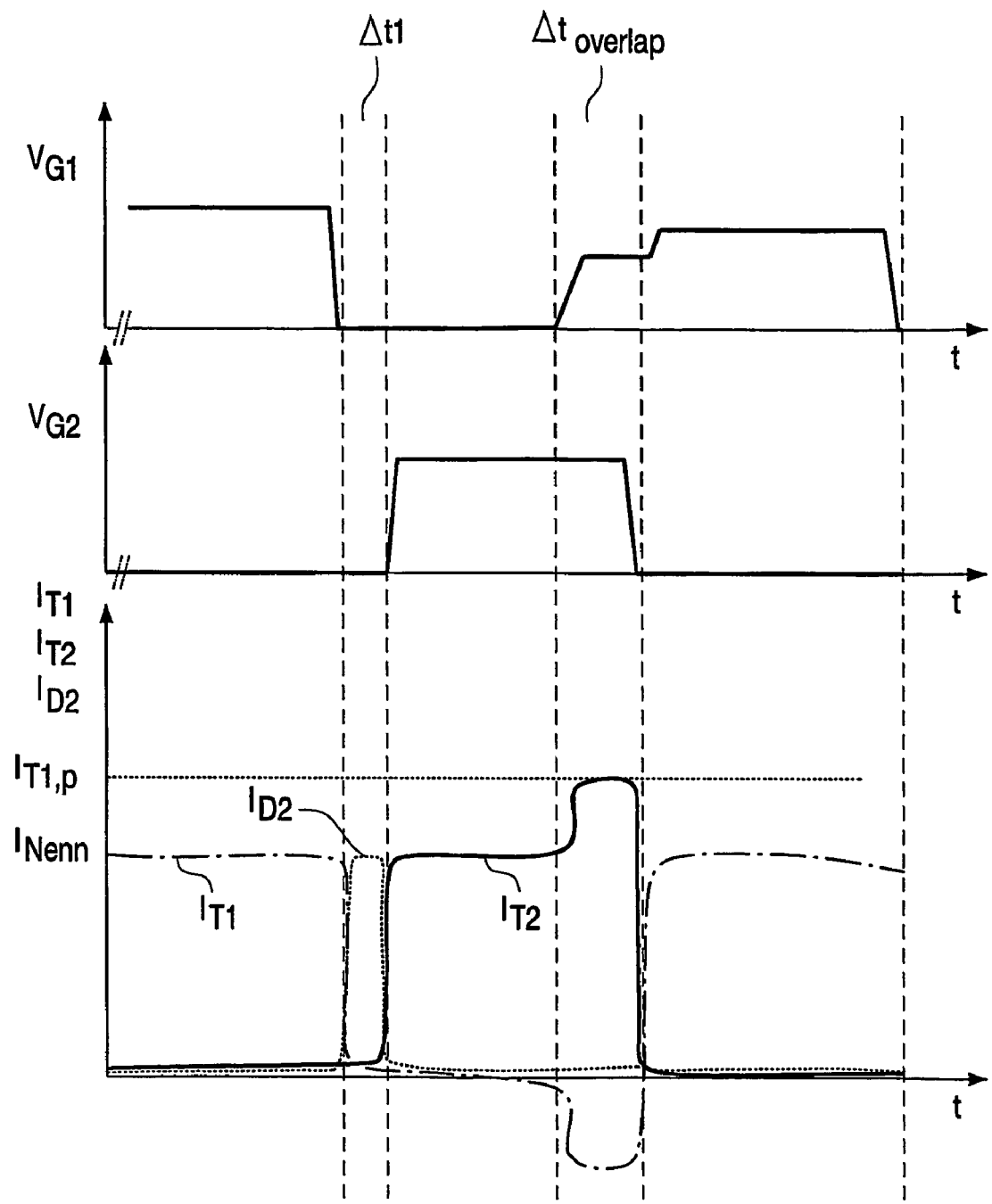
FIG. 9 shows a schematic diagram to illustrate the variation of currents and voltages of the circuit shown in FIG. 1, wherein driving takes place at a smaller gate voltage and the shoot through current is limited.

If, however, a longer period of overlap $\Delta t_{overlap}$, as shown in FIG. 9, causes a substantial shoot through current, then this shoot through current is limited to the maximum value $I_{T1,\,p}$ specified by the reduced gate voltage $U_{G1,p}$. As a result, substantial losses in $T_1$ occur. However, the risk of destructions caused by corresponding excessive currents no longer exists.

The value for $I_{T1,\,p}$ is specified such that the limitation becomes active as rarely as possible. $I_{T1,\,p}$ can be set to, for example, 2 times the nominal current $I_{Nenn}$ at the output of the converter circuit. In this case, the drive in accordance with the third embodiment serves as a protective mechanism which in the event that the above-mentioned control cannot effectively preclude an excessive current due to, for example, load changes or other effects, protects the circuit against destruction.

It is also possible, however, that a lower value for $I_{T1,p}$ is set, for example approximately 1.2 to 1.5 times the nominal current $I_{Nenn}$. This makes it possible, in addition to protection against damage by excessive currents, for example to reduce the amplitude of the oscillation of $V_{T2}$ and hence the emission of electromagnetic interference.

The above-described embodiments of the invention are explained with reference to synchronous buck converters. The mode of driving, the control methods and the current limitation can also be applied, however, in any desired combination in other converter topologies (FIGS. 1b–1d). In all topologies, the controller 26 that sets the drive of the switches can, on the one hand, control the output voltage in a known manner and, on the other hand, set the timing of switching such that the switching losses are minimized.

The invention claimed is:

1. A converter circuit comprising:
    at least a first switching element ($T_1$) and a second switching element ($T_2$) and an inductive element (L),
    wherein a control device (26) is provided to alternately switch the switching elements ($T_1$, $T_2$) so that a current ($I_L$) flows through the inductive element (L),
    and wherein at least at the second switching element ($T_2$) there is provided a freewheeling diode ($D_2$) which is capable of conducting the current flowing through the inductive element (L) after turn-off of the first switching element ($T_1$),
    wherein the control device (26) controls a timing of driving the switching elements ($T_1$, $T_2$) upon switching front the second switching element ($T_2$) to the first switching element ($T_1$) by determining whether one of a shoot through current occurs and the freewheeling diode ($D_2$) is conducting,
    wherein, upon the occurrence of the shoot through current, the timing of driving the switching elements ($T_1$, $T_2$) is changed such that the turn on of the first switching element ($T_1$) takes place later with respect to the instant of turn off of the second switching element ($T_2$),
    and when the freewheeling diode ($D_2$) is conducting, the timing of driving the switching elements ($T_1$, $T_2$) is changed such that the turn on of the first switching element ($T_1$) takes place sooner with respect to the instant of turn off of the second switching element ($T_2$).

2. A converter circuit as claimed in claim 1, wherein
    the switching elements ($T_1$, $T_2$) are driven such that they are simultaneously conducting during a period of overlap ($\Delta_{Toverlap}$),
    and wherein the control device (26) controls the duration of the period of overlap ($\Delta_{Toverlap}$) in that it is determined whether one of the shoot through current occurs and the freewheeling diode ($D_2$) is conducting,
    wherein, upon the occurrence of the shoot through current, the duration of the period of overlap is reduced,
    and, when the freewheeling diode ($D_2$) is conducting, the duration of the period of overlap is increased.

3. A converter circuit as claimed in claim 1, wherein
    the control device (26) comprises means for measuring a voltage ($V_{T2}$) across the second switching element ($T_2$), the voltage ($V_{T2}$) being observed at least after turn-off of the second switching element ($T_2$),
    and it is determined, by means of a voltage variation, whether one of the shoot through current occurs and the freewheeling diode ($D_2$) is conducting.

4. A converter circuit as claimed in claim 3, wherein
    the second switching element ($T_2$) is a MOSEET in a housing.
    wherein at least connecting lines for a drain, a source and a gate of the MOSFET are led from the housing to an exterior,
    wherein one or more measuring lines are provided for determining the voltage ($V_{T2}$) between the drain and the source.

5. A convener circuit as claimed in claim 3, wherein
    a peak value ($\hat{V}_{r2}$) is determined from an oscillating voltage obtained after turn-off of the second switching element ($T_2$).
    and the timing of the drive of the switching elements ($T_1$, $T_2$) is set such that said peak value ($\hat{V}_{r2}$) is minimized.

6. A converter circuit as claimed in claim 3, wherein
    a minimum value of the voltage ($V_{T2}$) across the second switching element ($T_2$) is determined,
    and the timing of driving the switching elements ($T_1$, $T_2$) is set such that the minimum value of the voltage lies between a forward voltage of the second switching element ($T_2$) and a forward voltage of the freewheeling diode ($D_2$).

7. A converter circuit as claimed in claim 1, wherein
    the control device (26) comprises means for measuring at least one electrical quantity ($V_{T2}$) of the converter circuit (12),
    in the course of at least a first switching period (T) at least one measurement is carried out,
    and said measurement is sued to set the timing of driving the switching elements ($T_1$, $T_2$) in a second switching period.

8. A converter circuit as claimed in claim 1, wherein
    at an onset of operation, upon switching from the second to the first switching element, a dead time is provided between the turn off of the second switching element ($T_2$) and the turn on of the firs switching element ($T_1$).

9. A converter circuit as claimed in claim 1, wherein
    upon switching from the second switching element ($T_2$) to the first switching element ($T_1$)
    the first switching element ($T_1$) is driven in such a way, for a protection period that lasts at least until the turn off of the second switching element ($T_2$), that the current through the first switching element ($T_1$) cannot exceed a threshold value ($I_{t1,\ max}$),
    which threshold value ($I_{t1,\ max}$) lies above a nominal output current of the converter circuit.

10. A drive device for alternatively switching a first switching element ($T_1$) and a second switching element ($T_2$) so that a current ($I_t$) flows through an inductive element (L), the second switching element ($T_2$) being provided with a freewheeling diode ($D_2$) which is capable of conducting the current ($I_1$) flowing through the inductive element (L) after turn-off of the first switching element ($T_1$), the drive device comprising:
    a pair of drive circuits (24, 25) for driving the first and second switching elements ($T_1$, $T_2$),
    and a control device (26) for determining whether one of a shoot through current occurs and a freewheeling diode ($D_2$) is conducting,
    the control device (26) controls the drive circuits (24, 25) wherein a timing of driving the first and second switching elements ($T_1$, $T_2$) upon switching from the second switching element ($T_2$) to the first switching element ($T_1$) is controlled such that, upon the occurrence of the shoot through current, the timing of driving the switching elements ($T_1$, $T_2$) is changed such that the turn on of the first switching element ($T_1$) takes place later than the instant of turn off of the second switching element ($T_2$), and when the freewheeling diode ($D_2$) is conducting, the timing of driving the switching elements ($T_1$, $T_2$) is changed such that the turn on of the first switching element ($T_1$) takes place before the instant of turn off of the second switching element ($T_2$).

11. A drive method for a convener switch comprising at least one half bridge (12) with a first and a second switching element ($T_1$, $T_2$), in which at least at the second switching element ($T_2$) and a freewheeling diode ($D_2$) is provided, wherein a timing of switching of the switching elements ($T_1$, $T_2$) upon switching from the second switching element ($T_2$) to the first switching element ($T_1$) is controlled, wherein it is determined whether one of the freewheeling diode ($D_2$) conducts and a shoot through current occurs, wherein, upon the occurrence of the shoot through current, the turn on of the first switching element ($T_1$) rakes place later with respect to the instant of turn off of the second switching element ($T_2$), and when the freewheeling diode ($D_2$) is conducting, the turn on of the first switching element ($T_1$) takes place sooner with respect to the instant of turn off of the second switching element ($T_2$).

* * * * *